US006985399B2

United States Patent
Lee

(12) United States Patent
(10) Patent No.: US 6,985,399 B2
(45) Date of Patent: Jan. 10, 2006

(54) MAIN WORD LINE DRIVER CIRCUIT RECEIVING NEGATIVE VOLTAGE IN SEMICONDUCTOR MEMORY DEVICE

(75) Inventor: Seung-hoon Lee, Suwon (KR)

(73) Assignee: Samsung Electronics Co., Ltd., (KR)

( * ) Notice: Subject to any disclaimer, the term of this patent is extended or adjusted under 35 U.S.C. 154(b) by 0 days.

(21) Appl. No.: 10/748,936

(22) Filed: Dec. 30, 2003

(65) Prior Publication Data
US 2004/0156260 A1 Aug. 12, 2004

(30) Foreign Application Priority Data
Feb. 6, 2003 (KR) ...................... 10-2003-0007413

(51) Int. Cl.
*G11C 8/00* (2006.01)
(52) U.S. Cl. .............................. 365/230.06; 365/230.01
(58) Field of Classification Search ........... 365/230.06, 365/226, 227
See application file for complete search history.

(56) References Cited

U.S. PATENT DOCUMENTS 5,973,963 A * 10/1999 Sugawara .............. 365/185.23
6,337,831 B1    1/2002 Nam ...................... 365/230.06
6,545,923 B2 *  4/2003 Sim et al. ................... 365/204
6,650,590 B2 * 11/2003 Inaba et al. ................. 365/226
2002/0163843 A1 11/2002 Sim et al. ................... 365/204

FOREIGN PATENT DOCUMENTS

KR        2002-0059916        7/2002

* cited by examiner

*Primary Examiner*—Thong Q. Le
(74) *Attorney, Agent, or Firm*—Mills & Onello LLP

(57) ABSTRACT

A main word line driver to which negative voltage is supplied in a semiconductor memory device is provided. The main word line driver circuit of a semiconductor memory device, the circuit which generates main word line signals enabling a plurality of main word lines, respectively, comprises a voltage supply unit which supplies a first voltage to a node and then supplies a second voltage higher than the first voltage; and a plurality of output units which receive the first voltage and second voltage supplied to the node and generate the respective main word line signals. In the circuit, the first voltage is a negative voltage and the second voltage is the ground voltage. Since the main word line driver circuit receives a negative voltage lower than a ground voltage and the ground voltage, the transition speed from a low level to a high level of a main word line signal does not decrease even during a low voltage operation of the main word line driver circuit.

6 Claims, 5 Drawing Sheets

MAIN WORD LINE DRIVER CIRCUIT RECEIVING NEGATIVE VOLTAGE IN SEMICONDUCTOR MEMORY DEVICE

This application claims priority from Korean Patent Application No. 03-7413, filed on Feb. 6, 2003, the contents of which are incorporated herein in their entirety by reference.

BACKGROUND OF THE INVENTION

1. Field of the Invention

The present invention relates to a semiconductor memory device, and more particularly, to a main word line driver circuit to which negative voltage is supplied in a semiconductor memory device.

2. Description of the Related Art

In order to reduce delay of a signal due to the resistance of poly-silicon used as a word line, a hierarchical word line structure, in which a word line is divided into a main word line (also referred to as a normal word line) and a sub-word line, is widely used. The hierarchical word line structure is disclosed by U.S. Pat. No. 5,416,748.

FIG. 1 is a schematic block diagram of a semiconductor memory device having a main word line driver circuit according to the prior art. The semiconductor memory device 100 comprises a command decoder 110, a row decoder 120, a main word line driver circuit 130, and a sub-word line driver circuit 190.

The command decoder 110 decodes a precharge command (PRECH CMD) and generates a precharge signal (PRECH) for precharging the main word lines to a low level, that is, a ground voltage. The row decoder 120 decodes row addresses (R_ADDR) and generates decoded row address signals (DRA1–DRAn, DRA_C1–DRA_C3).

In response to the precharge signal (PRECH) and decoded row address signals (DRA1–DRAn, DRA_C1–DRA_C3) the main word line driver circuit 130 generates main word line signals (MWE1–MWEn) which enables the main word lines, respectively. In response to the main word line signals (MWE1–MWEn), the sub-word line driver circuit 190 generates sub-word line signals (SWLs) for driving sub-word lines corresponding to the main word lines. For example, a main word line may correspond to four sub-word lines connected to memory cells (not shown).

FIG. 2 is a detailed diagram of the main word line driver circuit 130 of FIG. 1. Referring to FIG. 2, the main word line driver circuit 130 comprises a plurality of output units 141–14n and a ground voltage supply unit 150. For example, the ground voltage supply unit 150 may be commonly connected to eight output units.

The ground voltage supply unit 150 comprises three NMOS transistors 151, 152, and 153 serially connected, and the ground voltage (VSS) is connected to the source of the NMOS transistor 153. In response to the activation of the decoded row address signals (DRA_C1–DRA_C3), the ground voltage supply unit 150 supplies the ground voltage (VSS) to a node (NODE2).

The output unit 141 comprises a PMOS transistor 1411, an inverter 1412, and an NMOS transistor 1413, and a boosting voltage (VPP) is connected to the source of the PMOS transistor 1411.

First, an operation in which a first main word line signal (MWE1) is inactivated to a low level, that is, the ground voltage level (VSS), will now be described. In response to the activation of the precharge signal (PRECH), the PMOS transistor 1411 of the first output unit 141 pulls up the electric potential of the node (NODE1) to a high level, that is, the boosting voltage (VPP) level. The inverter 1412 inverts the electric potential of the node (NODEL) that is in a high level, to a low level such that a low level first main word line signal (MWE1) is generated.

Next, an operation in which the first main word line signal (MWE1) is activated to a high level, that is, the boosting voltage (VPP), will now be described. In response to the activation of the decoded row address signal (DRA1), the NMOS transistor 1413 of the first output unit 141 transfers the electric potential of the node (NODE2), which is pulled down to a low level, that is, VSS, by the ground voltage supply unit 150, to the node (NODE1). The inverter 1412 inverts the electric potential of the node (NODE1), which is pulled down to the low level, such that a high level first main word line signal (MWE1) is generated.

Since the output units 142–14n have the same elements as those of the first output unit 141, the description of the first output unit 141 can be referred to for detailed explanation of the output units 142–14n. However, the output units 142–14n generate main word line signals (MWE2–MWEn), respectively, in response to the precharge signal (PRECH) and decoded row address signals (DRA2–DRAn, DRA_C1–DRA_C3).

Recently, the voltages of control signals, that is, decoded row address signals (DRA1–DRAn, DRA_C1–DRA_C3), controlling the main word line driver circuit 130 have been lowered as semiconductor memory device have been using low supply voltages (VCC, for example, 2V or less). Accordingly, when the decoded row address signal (DRA1) is activated by a low supply voltage (VCC) and the ground voltage (VSS) is supplied to the node (NODE2) by the ground voltage supply unit 150, the gate voltage (Vgs) to the source of the NMOS transistor 1413 of the first output unit 141 may be a little higher than the threshold voltage of the NMOS transistor 1413. Therefore, the operation speed of the NMOS transistor 1413 which pulls down the node (NODEL) to a low level, that is, the ground voltage level (VSS), may be decreased. As a result, the transition speed from a low level to a high level of the main word line signal (MWE1) may be decreased.

SUMMARY OF THE INVENTION

The present invention provides a main word line driver circuit of a semiconductor memory device which has a stable operating speed even at a low voltage.

According to an aspect of the present invention, there is provided a main word line driver circuit of a semiconductor memory device, the circuit generating main word line signals enabling a plurality of main word lines, respectively, comprising: a voltage supply unit which supplies a first voltage to a node and then supplies a second voltage higher than the first voltage; and a plurality of output units which receive the first voltage and second voltage supplied to the node and generate the respective main word line signals.

In the circuit, the first voltage can be a negative voltage and the second voltage can be the ground voltage.

In the circuit, the voltage supply unit can include a negative voltage supply unit which supplies the negative voltage to the node; and a ground voltage supply unit which supplies the ground voltage to the node.

In the circuit, the negative voltage supply unit can supply the negative voltage to the node in response to activation of decoded row address signals.

In the circuit, one of the decoded row address signals can be activated as the supply voltage for a predetermined time interval.

In the circuit, the negative voltage supply unit can include three NMOS transistors which are serially connected and turned on/off in response to the decoded row address signals, and the negative voltage is connected to an end of the NMOS transistors.

Since the main word line driver circuit of a semiconductor memory device according to the present invention receives a negative voltage lower than a ground voltage and the ground voltage, the transition speed from a low level to a high level of a main word line signal enabling the main word line does not decrease even during a low voltage operation of the main word line driver circuit.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

Figure 1:
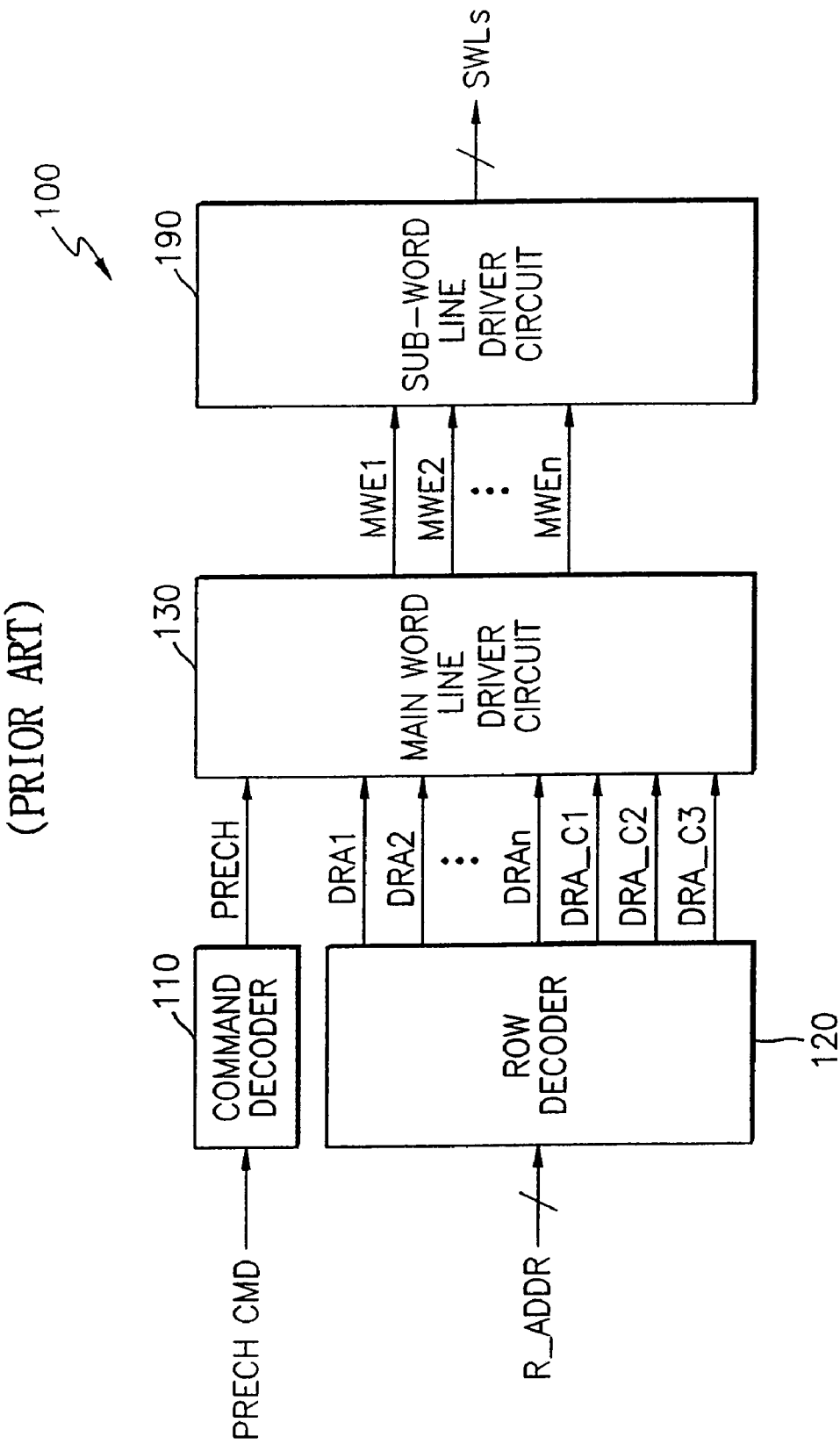
FIG. 1 is a schematic block diagram of a semiconductor memory device having a main word line driver circuit according to the prior art.
Figure 2:
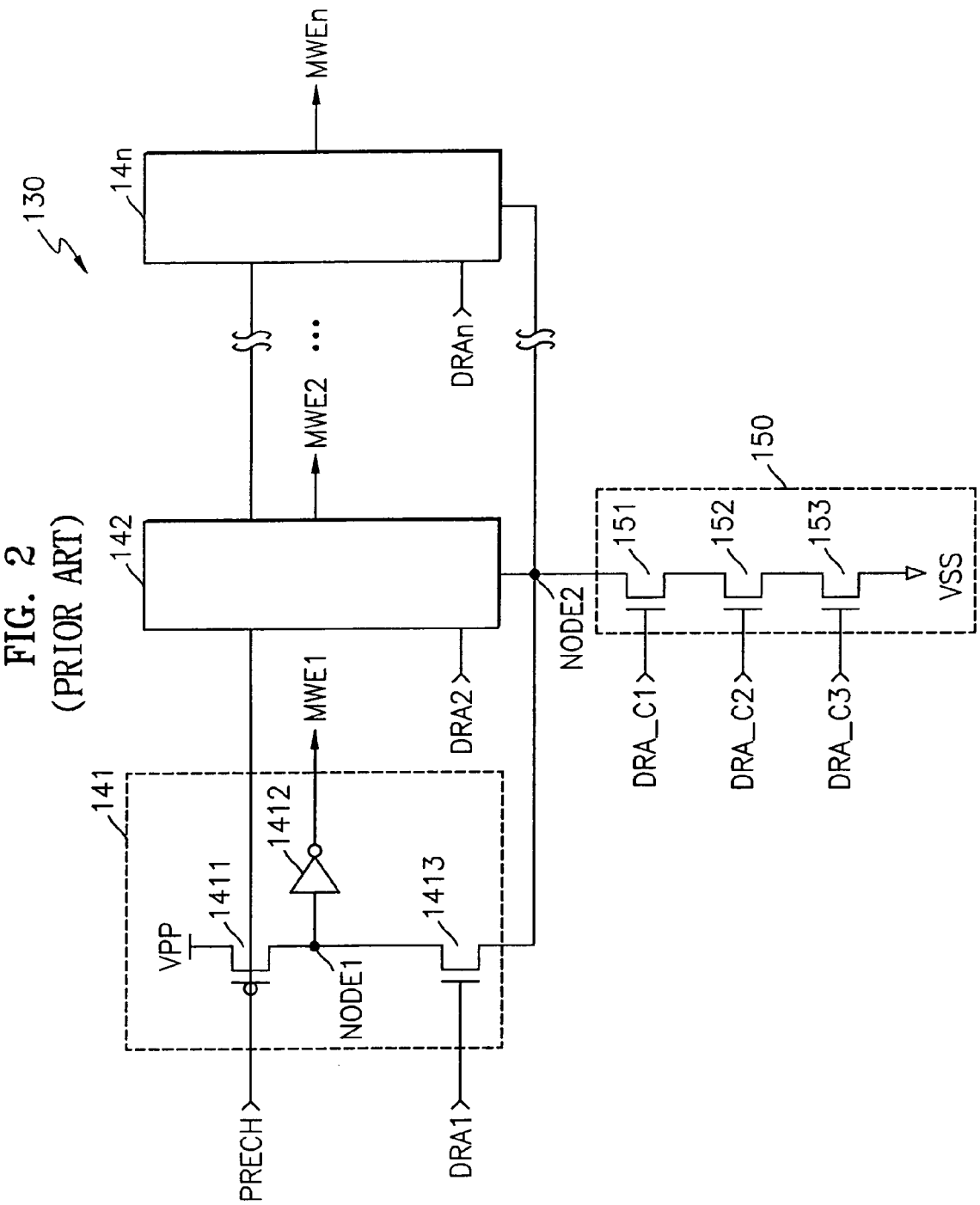
FIG. 2 is a detailed diagram of the main word line driver circuit of FIG 1.
Figure 3:
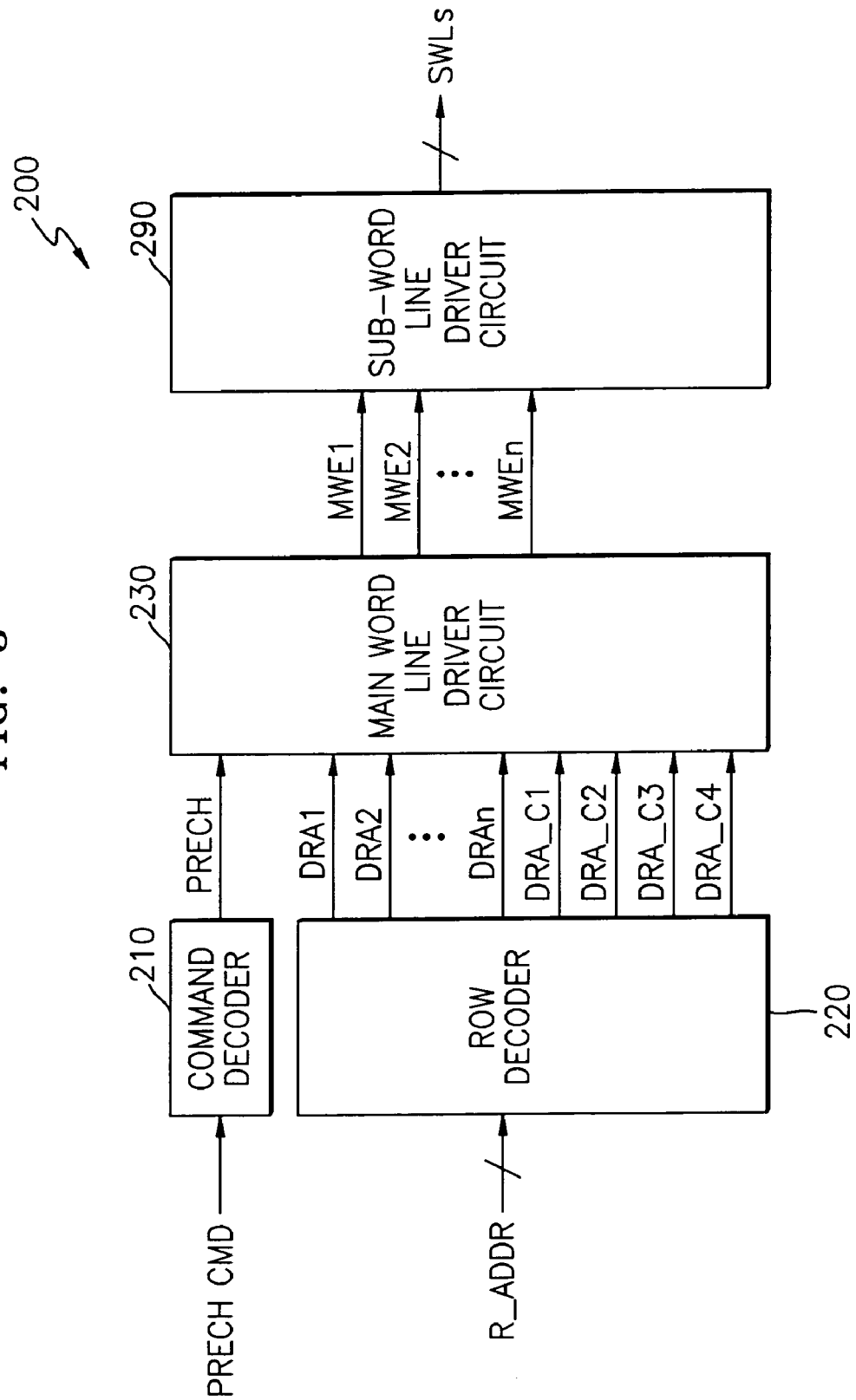
FIG. 3 is a schematic block diagram of a semiconductor memory device having a main word line driver circuit according to a preferred embodiment of the present invention.

FIG. 3 is a schematic block diagram of a semiconductor memory device having a main word line driver circuit according to a preferred embodiment of the present invention. The semiconductor memory device 200 comprises a command decoder 210, a row decoder 220, a main word line driver circuit 230, and a sub-word line driver circuit 290.

The command decoder 210 decodes a precharge command (PRECH CMD) and generates a precharge signal (PRECH) for precharging the main word lines to a low level, that is, a ground voltage. The row decoder 220 decodes row addresses (R_ADDR) and generates decoded row address signals (DRA1–DRAn, DRA_C1–DRA_C4).

In response to the precharge signal (PRECH) and decoded row address signals (DRA1–DRAn, DRA_C1–DRA_C4) the main word line driver circuit 230 generates main word line signals (MWE1–MWEn) which enables the main word lines, respectively.

In response to the main word line signals (MWE1–MWEn), the sub-word line driver circuit 290 generates sub-word line signals (SWLs) for driving sub-word lines corresponding to the main word lines. For example, a main word line may correspond to four sub-word lines connected to memory cells (not shown).

Figure 4:
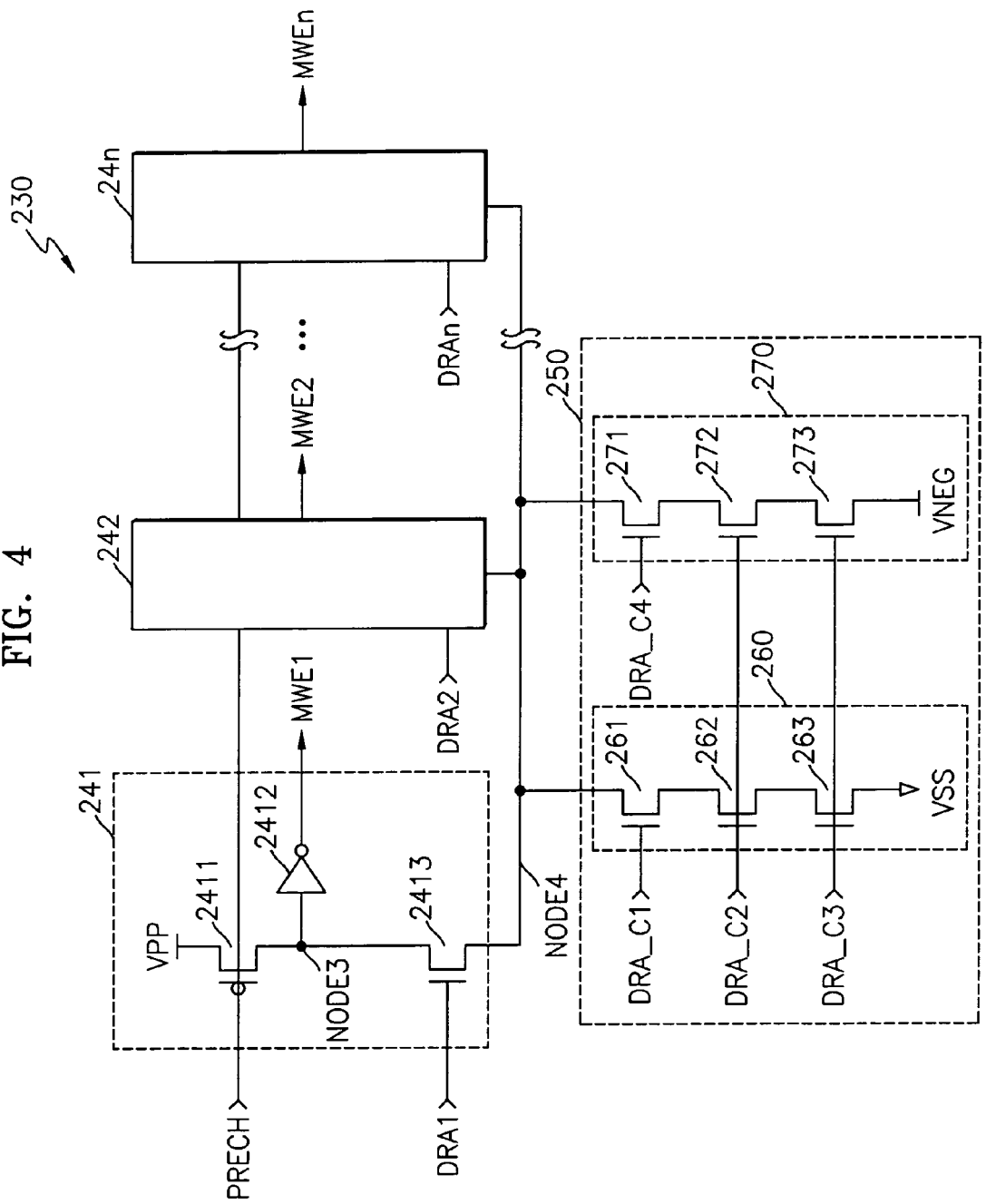
FIG. 4 is a detailed diagram of the main word line driver circuit of FIG. 3.

FIG. 4 is a detailed diagram of the main word line driver circuit of FIG. 3. Referring to FIG. 4, the main word line driver circuit 230 comprises a plurality of output units 241–24n and a voltage supply unit 250. It is preferable that the voltage supply unit 250 be commonly connected to the eight output units.

More specifically, the voltage supply unit 250 comprises a ground voltage supply unit 260 and a negative voltage supply unit 270.

The negative voltage supply unit 270 comprises three NMOS transistors 271–273 serially connected and a negative voltage (VNEG, for example, –0.5V) that is a first voltage is connected to the source of the NMOS transistor 273. In response to activation of the decoded row address signals (DRA_C2–DRA_C4), the negative voltage supply unit 270 supplies the negative voltage (VNEG) to the node (NODE4). The negative voltage (VNEG) supplied to the node (NODE4) increases the gate voltage (Vgs) to the source of the NMOS transistor 2413 such that a current flowing through the NMOS transistor 2413 increases. As a result, since the operation speed of the NMOS transistor 2413 increases, the electric potential of the node (NODE3) is quickly transited to a low level, and the main word line signal (MWE1) is also quickly activated to the boosting voltage (VPP). That is, though the operation voltage of the decoded row address signal (DRA1) is a low voltage (for example, 2V or less), the negative voltage (VNEG) is supplied to the node (NODE4), and accordingly the operation speed of the NMOS transistor 2413 can avoid a speed decrease.

The ground voltage supply unit 260 comprises three NMOS transistors 261–263 serially connected and the ground voltage (VSS) that is a second voltage is connected to the source of the NMOS transistor 263. In response to activation of the decoded row address signals (DRA_C1–DRA_C3), the ground voltage supply unit 260 supplies the ground voltage (VSS) to the node (NODE4).

The first output unit 241 comprises a PMOS transistor 2411, an inverter 2412, an NMOS transistor 2413 and a boosting voltage (VPP) is connected to the source of the PMOS transistor 2411. Each of the output units 242–24n also comprises the same elements as those of the first output unit 241.

First, an operation in which the first main word line signal (MWE1) is transited to a high level, that is, the boosting voltage (VPP); will now be described. In response to activation of the decoded row address signals (DRA_C2–DRA_C4), the negative voltage supply unit 270 supplies the negative voltage (VNEG) to the node (NODE4) for a predetermined time interval. Here, the decoded row address signal (DRA_C4) is a pulse signal which is activated to a high level, that is, the supply voltage (VCC), for a predetermined time interval. After the negative voltage (VNEG) is supplied to the node (NODE4) for the predetermined time, the ground voltage (VSS) is supplied to the node (NODE4) by the ground voltage supply unit 260. Accordingly, the operation speed of the NMOS transistor 2413 of the first output unit 241 increases. In response to activation of the decoded row signal (DRA1), the NMOS transistor 2413 quickly transfers the electric potential, which is supplied in turn by the negative voltage supply unit 270 and the ground voltage supply unit 250, to the node (NODE3). The inverter 2412 of the first output unit 241 inverts the electric potential of the node (NODE3) such that a high level first main word line signal (MWE1) is quickly generated.

Next, an operation in which the first main word line signal (MWE1) is inactivated to a low level, that is, the ground voltage level (VSS), will now be described. In response to activation of the precharge signal (PRECH), the PMOS transistor 2411 of the first output unit 241 pulls up the electric potential of the node (NODE3) to a high level, that is, the boosting voltage level (VPP). The inverter 2412 inverts the electric potential of the node (NODE3), which is in a high level, to a low level such that a low level first main word line signal (MWE1) is generated.

The output units 242–24n have the same elements as the first output unit 241. The description of the first output unit 241 can be referred to for detailed description of the units 242–24n. However, the output units 242–24n quickly generate main word line signals (MWE2–MWEn), respectively, in response to activation of the precharge signal (PRECH) and decoded row address signals (DRA2–DRAn, DRA_C1–DRA_C4).

Figure 5:
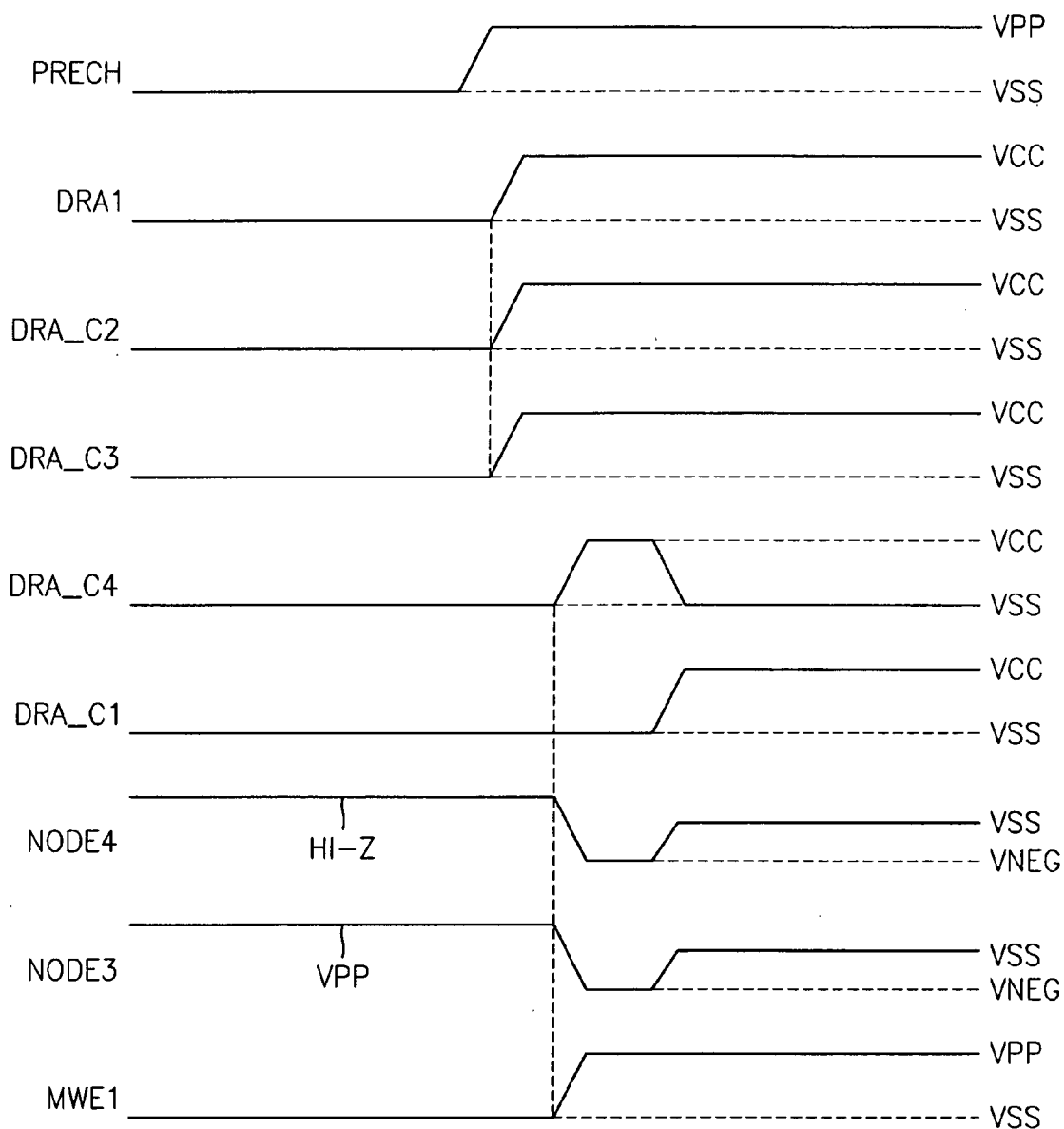
FIG. 5 is a timing diagram showing the operation of the main word line driver circuit shown in FIG. 4.

FIG. 5 is a timing diagram showing the operation of the main word line driver circuit shown in FIG. 4. That is, FIG. 5 is a timing diagram showing activation/inactivation operations of the first main word line signal (MWE1).

When the precharge signal (PRECH) is activated to the ground voltage (VSS), the electric potential of the node (NODE3) is pulled to the boosting voltage (VPP) and the first main word line signal (MWE1) is inactivated to the ground voltage (VSS).

After the precharge signal (PRECH) is transited from the ground voltage (VSS) to the boosting voltage (VPP), the decoded row address signals (DRA1, DRA_C2, DRA_C3) are transited from the ground voltage (VSS) to the supply voltage (VCC) and the decoded address signal (DRA_C4) is activated to the supply voltage (VCC) for a predetermined time interval. Then, the electric potential of the node (NODE4) is transited from a high impedance state (HI-Z) to the negative voltage (VNEG) and the electric potential of the node (NODE3) is rapidly transited from the boosting voltage (VPP) to the negative voltage (VNEG). As a result, the first main word line signal (MWE1) is quickly activated from the ground voltage (VSS) to the boosting voltage (VPP).

When the decoded row address signal (DRA_C4) is transited from the supply voltage (VCC) to the ground voltage (VSS), the decoded row address signal (DRA_C1) is transited from the ground voltage (VSS) to the supply voltage (VCC). Then, the electric potential of the nodes (NODE4 and NODE3) are transited from the negative voltage (VNEG) to the ground voltage (VSS) and the ground voltage of the electric potential of the nodes (NODE4 and NODE3) are maintained. Then, the activation state of the boosting voltage (VPP) of the first main word line signal (MWE1) is maintained.

Meanwhile, since the activation/inactivation operations of the main word line signals (MWE2–MWEn) are similar to those of the first main word line signal (MWE1) referring to the FIG. 5, the description of the first main word line signal (MWE1) can be referred to for description of the other main word line signals.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A main word line driver circuit of a semiconductor memory device, the circuit generating main word line signals enabling a plurality of main word lines, respectively, comprising:

a voltage supply unit which supplies a first voltage to a first node during a first time interval and then supplies a second voltage higher than the first voltage to the first node for a second time interval later than the first time interval; and a plurality of output units connected to the first node which receive the first voltage and the second voltage supplied to the first node, each of the output units receiving a precharge signal and a respective decoded row address signal and comprising a second node inverted by an inverter to generate a respective main word line signal output by the output unit, the second node being connected to the first node through a transistor in response to the respective decoded row address signal such that the second node receives through the transistor the first and second voltages generated by the voltage supply unit in response to the respective decoded row address signal, each output unit, in response to the precharge signal and the respective decoded row address signal and the first and second voltages, generating the respective main word line signal.

2. The circuit of claim 1, wherein the first voltage is a negative voltage and the second voltage is ground voltage.

3. The circuit of claim 2, wherein the voltage supply unit comprises:

a negative voltage supply unit which supplies the negative voltage to the first node; and a ground voltage supply unit which supplies the ground voltage to the first node.

4. The circuit of claim 3, wherein the negative voltage supply unit supplies the negative voltage to the first node in response to activation of decoded row address signals.

5. The circuit of claim 4, wherein one of the decoded row address signals is activated as the supply voltage for the first time interval.

6. The circuit of claim 5, wherein the negative voltage supply unit comprises three NMOS transistors which are serially connected and turned on/off in response to the decoded row address signals, and the negative voltage is connected to an end of the NMOS transistors.

* * * * *